Dec. 13, 1966 J. J. CHANG 3,290,753

METHOD OF MAKING SEMICONDUCTOR INTEGRATED CIRCUIT ELEMENTS

Filed Aug. 19, 1963

INVENTOR
J. J. CHANG
BY
H. W. Lockhart
ATTORNEY

United States Patent Office 3,290,753

Patented Dec. 13, 1966

3,290,753
METHOD OF MAKING SEMICONDUCTOR INTEGRATED CIRCUIT ELEMENTS

Joseph J. Chang, Berkeley Heights, N.J., assignor to Bell Telephone Laboratories, Incorporated, New York, N.Y., a corporation of New York Filed Aug. 19, 1963, Ser. No. 302,966
3 Claims. (Cl. 29—25.3)

Figure 1:
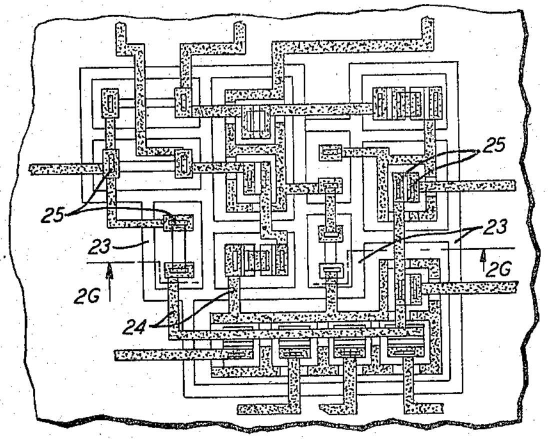

This invention relates to semiconductor integrated circuit devices and particularly to the fabrication of an array of semiconductor elements which are electrically isolated one from another and form a single unitary structure.

The semiconductor integrated circuit art currently uses two general approaches for fabricating integrated devices. According to one general method, the substrate for a semiconductor integrated circuit comprises a solid slice of monocrystalline semiconductor material. The various elements of the circuit are fabricated in separated portions of the slice by solid state diffusion using masking and other techniques well known in the art. Electrical isolation between the individual elements, which may comprise transistors, diodes, and other active or passive devices, is provided by zones of particular conductivity type and value. In other words, isolation is provided by interposing one or more PN junctions. Electrical interconnections between the particular electrodes of the individual elements of the circuit are provided advantageously by metal films deposited on the surface of the slice of material. This is conveniently done through masks by well-known methods.

The other general approach to the fabrication of integrated circuit devices is to mount individual semiconductor wafers in close proximity on a common insulating mounting material such as a ceramic plate. Each semiconductor wafer contains at least a circuit element to be included in the integrated circuit, and an individual wafer may contain several active elements in certain configurations. Interconnection between the electrodes of the different elements is provided usually by fine wires which are thermocompression bonded to the element electrodes.

Devices fabricated in accordance with the first approach have the disadvantage in many applications of unwanted parasitic electrical effects as a result of inadequate isolation between individual elements. Under certain circumstances, reverse leakage current flows across the isolating junctions. Of even greater consequence, however, is the effect of capacitive coupling across the isolating junctions. Moreover, the difficulties inherent in the fabrication of such large isolating PN junctions results in relatively low production yields.

Integrated circuit devices fabricated in accordance with the other general technique afford excellent electrical isolation but require complex thermocompression bonded wire interconnections which are laborious to apply and may be the source of unwanted inductance and of mechanical and electrical failure.

Therefore, an object of this invention is an improved semiconductor integrated circuit device.

In particular, an object of this invention is a semiconductor substrate for integrated circuit fabrication having a high degree of electrical isolation between separate elements and at the same time permitting facile circuit interconnections of deposited metal films.

One specific form of this invention is a method in which one major surface of a semiconductor slice is treated so as to produce a network of slots conforming to the desired isolation pattern between individual semiconductor wafers. This network may be produced by such techniques as etching using an etch-resistant mask produced by photoresist processes. A dielectric layer, for example of glass or silicon dioxide, then is deposited on this slotted surface so as to fill the slots and provide a thin but complete layer thereon. To this dielectric surface a backing layer is applied for mechanical support. Several alternative schemes are available for doing this including cementing the slice to a piece of low quality semiconductor material, typically silicon because of its excellent thermal properties. The slice then is reversed and a layer of material is removed from the opposite major surface by etching or mechanical polishing to a depth sufficient, at least, to reach the bottom of the slots thereby producing an array of isolated semiconductor wafers. These isolated semiconductor "islands" then are treated using standard techniques including epitaxial deposition and solid state diffusion to fabricate the elements of the integrated circuit. Interconnections are conveniently made between these elements by metal film deposition.

The method in accordance with this invention therefore provides a high degree of electrical isolation by incorporating a glass or comparable dielectric barrier between elements while at the same time affording a structure upon which metal films may be deposited affording great facility and improved reliability for the interconnections of the integrated circuit.

The invention and its other objects and features may be better understood from the following more detailed description taken in connection with the drawing in which:

FIG. 1 is a plan view of a portion of an integrated circuit element in accordance with this invention; and FIGS. 2A through 2G show in schematic cross section the major steps in the method in accordance with this invention for making an integrated circuit element.

Figure 2A:
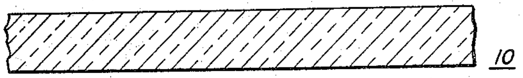
Figure 2B:
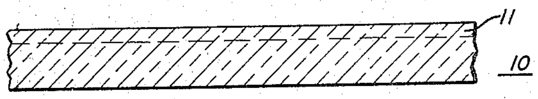

Referring to the drawing, one specific method in accordance with this invention begins with the preparation of a slice 10 of N-type conductivity silicon as shown in cross section in FIG. 2A. In one specific procedure, this slice is subjected to an N-type diffusion from one surface as shown in FIG. 2B to produce a region of N+ conductivity 11. This configuration is particularly advantageous for circuits which will include transistors for providing a collector region of low resistance. Alternatively, in lieu of this diffusion step, the entire slice may be of N+ material and subsequent processing includes epitaxial deposition of a high resistivity N layer.

The slice 10 as shown in FIG. 2B then is polished on the N+ surface and a layer of aluminum about 500 angstroms thick is evaporated on this polished surface. Following this step a layer of nickel about 5000 angstroms thick is evaporated on top of the aluminum. The slice then is heated at about 600 degrees centigrade for about five minutes in a vacuum so as to sinter the deposited metals to the semiconductor material to produce the metal film 12.

Figure 2C:
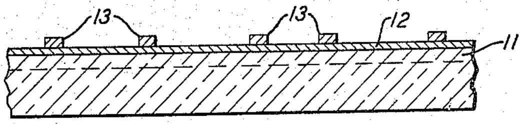

Next, referring to FIG. 2C, a pattern of photoresist material 13 is produced on this metallized surface in accordance with well-known techniques and as disclosed, for example, in Patent 3,122,817 issued to J. A. Andrus granted March 3, 1964. This photoresist pattern conforms to the isolation pattern desired between the individual semiconductor wafers of the final integrated circuit element.

Figure 2D:
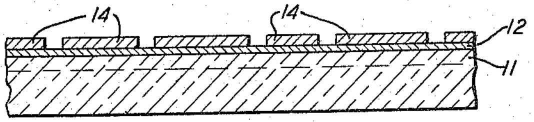

Next, a layer of gold 14 is electrolytically plated to a depth of about 2.5 microns on the photoresist masked surface. As is well known, the gold plates on the exposed metallized portions and not on the photoresist areas. Thus, as shown in FIG. 2D, after washing off the photoresist material using a suitable solvent, the slice has a gold masking pattern 14 over a thin aluminum-nickel layer 12 on the semiconductor surface.

Figure 2E:
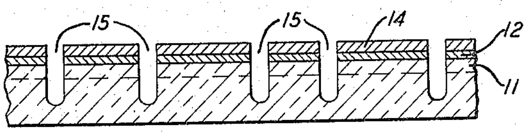

This gold-masked surface then is treated with an etching solution which typically may be a mixture of hydrofluoric and nitric acids in standard, well-known proportions. This treatment removes the exposed aluminum-nickel portions as well as the silicon semiconductor material underlying these exposed metallized portions. This etch does not attack the gold plating 14 and, accordingly, the portions covered by the gold are unaffected. The result, in somewhat exaggerated illustrative form, is as shown in FIG. 2E. The slice 10 thus has a network of relatively deep slots 15 produced therein to a substantially uniform depth. It will be understood, particularly by referring to the plan view of FIG. 1, that the slots are produced in both directions across the slice so as to form a rectilinear pattern. Moreover, it will be understood that a great variety of patterns and configurations, including curved boundaries, may be produced.

As the next step the gold layer 14 is removed by treatment with aqua regia, and finally the remaining metal layer 12 and other debris are removed by a clean-up etch using again the hydrofluoric-nitric acid mixture.

Figure 2F:
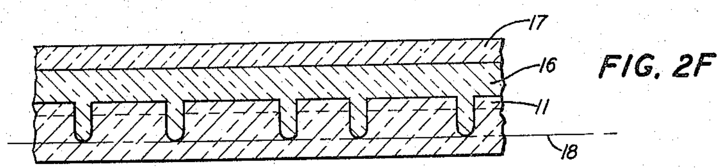

Referring to FIG. 2F, the slice then is placed in an evaporation apparatus and a layer 16 of silicon dioxide is deposited so as to fill the slots and to build up a layer of this dielectric on the slotted surface. Next, to this silicon dielectric surface a backing piece 17 of polycrystalline or low quality silicon is attached by cementing so as to provide mechanical support. It will be obvious that, alternatively, this polycrystalline silicon layer may be applied by deposition. As mentioned heretofore, silicon is particularly advantageous for this use because of its thermal matching qualities and particularly because of its relatively good theermal conduction.

Figure 2G:
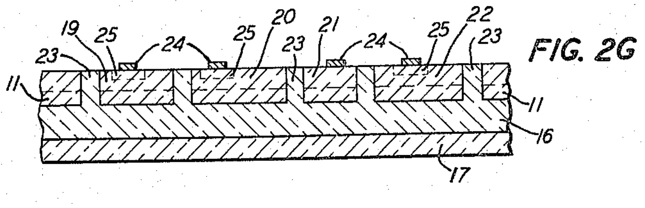

Then, the slice is inverted and semiconductor material is removed to a depth sufficient to reach the bottom of the slots along the broken line 18 shown in FIG. 2F. Thus, as shown in FIG. 2G, the result is an integral array of semiconductor wafers 19, 20, 21, 22 isolated by insulating channels 23 of oxide and supported by the silicon backing piece 17. This planar structure enables the facile interconnection of the elements of the integrated circuit by means of deposited metal strips 24 which are best seen in the plan view of FIG. 1. As mentioned heretofore, the various devices are fabricated in the individual wafers of the slice shown in FIG. 2G by techniques which may include an epitaxial deposition of silicon or other semiconductor material on the isolated semiconductor wafers and by solid state diffusion of significant impurities into specific regions of the isolated wafers to produce PN junctions 25, shown by way of example. It is well known in the art to utilize such techniques for the fabrication not only of active devices such as transistors and diodes but also for passive elements, particularly resistors and PN junction capacitors.

As an alternative to the foregoing described procedure, the pattern of isolating slots may be produced by a fewer number of manipulative steps using etch-resistant masks directly without metal deposition. For example, where slots on the order of one mil in width are satisfactory, the masking material commercially known as KMER (Kodak metal etch resistant) may be used to produce the etch-resistant patterns to which the hydrofluoric-nitric acid etch is directly applied. Moreover, in arrangements in which the depth of etching is relatively shallow and a higher degree of definition is desired, another etch-resistant material KPR (Kodak photoresist) may be utilized. The use of these organic photosensitive coatings is well known in the art for the production of etch-resistant patterns suitable for a variety of arrangements.

Moreover, in addition to these photosensitive coatings, the well-known technique of wax coating and scribing to produce an etch-resistant pattern may be resorted to.

Referring to FIG. 1, the network of shaded strips 24 represent the pattern of interconnections of the integrated circuit. These strips interconnect the deposited metal electrodes 25 which provide substantially ohmic connections to the circuit elements. Finally, as has been described in detail hereinbefore, the channels 23 define the oxide filled slots which electrically insulate the several parts or element assemblies of the integrated device from one another.

Although the invention has been described in terms of particular semiconductor material, it is apparent that other material may be employed including germanium and the intermetallic compound materials and that in addition to silicon dioxide as a deposited isolating dielectric other glasses having suitable properties may be employed similarly subject to the considerations of thermal, electrical and chemical capability. Thus there are other arrangements which may be produced by those skilled in the art which also will fall within the scope and spirit of this invention.

What is claimed is:

1. The fabrication of a semiconductor integrated circuit having a plurality of electrically isolated wafers comprising the steps of:

(a) preparing a slice of monocrystalline silicon, (b) treating the slice to form therein a layer of the same conductivity type but of differing conductivity from that of the original slice, (c) producing on one major surface of said slice an etch-resistant mask conforming to the desired isolation pattern, (d) etching said masked surface to produce a network of slots in accordance with this said pattern, (e) removing the etch-resistant mask, (f) depositing by evaporation in the network of slots and on said slotted surface a layer of silicon dioxide, (g) removing from the opposite major surface of said slice a layer of semiconductor material of a thickness so as to at least reach the bottom of said slots thereby producing an array of isolated semiconductor wafers in said slice, (h) introducing significant impurities into said wafers to form therein areas of opposite conductivity type defining PN junctions, (i) forming on said opposite major surface a deposited metal film pattern interconnecting said circuit elements.

2. The method in accordance with claim 1 in which step (h) includes introducing significant impurities into said wafers by solid state diffusion.

3. The method in accordance with claim 1 in which the etch-resistant mask of step (c) comprises forming a gold-aluminum-nickel coating on selected portions of the semiconductor surface by photolithography.

References Cited by the Examiner

UNITED STATES PATENTS

| | | | |
|---|---|---|---|
| 2,958,120 | 11/1960 | Taylor | 156—3 |
| 3,217,209 | 11/1965 | Kinsella et al. | 156—3 X |

OTHER REFERENCES

Flush Printed Circuits, E. D. Miles, I.B.M. Technical Disclosure, vol. 1, No. 2, Aug. 1958, p. 25.

ALEXANDER WYMAN, *Primary Examiner.*

JACOB H. STEINBERG, *Examiner.*